United States Patent
Fischer et al.

(10) Patent No.: US 9,723,425 B2
(45) Date of Patent: Aug. 1, 2017

(54) BASS MANAGEMENT FOR AUDIO RENDERING

(71) Applicant: DOLBY LABORATORIES LICENSING CORPORATION, San Francisco, CA (US)

(72) Inventors: David Matthew Fischer, San Francisco, CA (US); Timothy James Eggerding, Oakland, CA (US); Eugene Edward Radzik, San Leandro, CA (US); Adam Christopher Noel, Oakland, CA (US); David S. McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/899,481

(22) PCT Filed: Jun. 17, 2014

(86) PCT No.: PCT/US2014/042654
§ 371 (c)(1),
(2) Date: Dec. 17, 2015

(87) PCT Pub. No.: WO2014/204911
PCT Pub. Date: Dec. 24, 2014

(65) Prior Publication Data
US 2016/0150347 A1    May 26, 2016

Related U.S. Application Data

(60) Provisional application No. 61/836,519, filed on Jun. 18, 2013.

(51) Int. Cl.
*H04R 5/02* (2006.01)
*H04S 7/00* (2006.01)
(Continued)

(52) U.S. Cl.
CPC ........... *H04S 7/308* (2013.01); *H03G 11/008* (2013.01); *H04R 3/04* (2013.01); *H04R 3/12* (2013.01);
(Continued)

(58) Field of Classification Search
CPC .... H04R 3/04; H04R 3/12; H04R 3/14; H04S 3/008; H04S 5/00; H04S 7/30;
(Continued)

(56) References Cited

U.S. PATENT DOCUMENTS 6,332,026 B1    12/2001  Kuusama
6,381,333 B1    4/2002   Suzuki
(Continued)

FOREIGN PATENT DOCUMENTS

JP    2005-525022    8/2005
JP    2006-129372    5/2006
(Continued)

OTHER PUBLICATIONS

Stanojevic, Tomislav et al. "Some Technical Possibilities of Using the Total Surround Sound Concept in the Motion Picture Technology," 133rd SMPTE Technical Conference and Equipment Exhibit, Los Angeles Convention Center, Los Angeles, California, Oct. 26-29, 1991, 3 pages.
(Continued)

*Primary Examiner* — Hemant Patel

(57) ABSTRACT

Improved methods and devices for processing low-frequency audio data are provided. A bass extraction process may involve applying low-pass filters to received audio object signals, to produce extracted low-frequency audio signals. The bass extraction process may be performed prior to a process of rendering audio objects into speaker feed signals. A bass management process may involve routing the extracted low-frequency audio signals to the one or more
(Continued)

speakers capable of reproducing low-frequency audio signals.

40 Claims, 11 Drawing Sheets

(51) Int. Cl.
*H04R 3/12* (2006.01)
*H04S 5/00* (2006.01)
*H03G 11/00* (2006.01)
*H04R 3/04* (2006.01)
*H04R 3/14* (2006.01)
*H04S 3/00* (2006.01)

(52) U.S. Cl.
CPC .............. *H04R 3/14* (2013.01); *H04S 3/008* (2013.01); *H04S 5/00* (2013.01); *H04S 7/30* (2013.01); *H04S 2400/03* (2013.01); *H04S 2400/07* (2013.01); *H04S 2400/11* (2013.01)

(58) Field of Classification Search
CPC .. H04S 7/308; H04S 2400/03; H04S 2400/07; H04S 2400/11; H04G 11/008; H03G 11/008
See application file for complete search history.

(56) References Cited

U.S. PATENT DOCUMENTS

| | | |
|---|---|---|
| 7,236,838 B2 | 6/2007 | Katayama |
| 7,826,626 B2 | 11/2010 | Bharitakar |
| 7,974,417 B2 | 7/2011 | Kim |
| 8,238,576 B2 | 8/2012 | Cooper |
| 2004/0252844 A1 | 12/2004 | Christensen |
| 2006/0050896 A1 | 3/2006 | Sung |
| 2006/0280311 A1* | 12/2006 | Beckinger ................ H04S 3/00 381/17 |
| 2007/0003075 A1* | 1/2007 | Cooper ..................... H04S 3/00 381/98 |
| 2007/0041591 A1 | 2/2007 | Suguta |
| 2008/0075302 A1 | 3/2008 | Wei |
| 2009/0116653 A1 | 5/2009 | Yoshino |
| 2010/0076772 A1* | 3/2010 | Kim ..................... G10L 19/008 704/500 |
| 2010/0228368 A1 | 9/2010 | Oh |
| 2010/0278346 A1 | 11/2010 | Hogue |
| 2012/0014524 A1 | 1/2012 | Vafiadis |
| 2012/0308042 A1 | 12/2012 | Victor |
| 2013/0096912 A1 | 4/2013 | Resch |

FOREIGN PATENT DOCUMENTS

| | | |
|---|---|---|
| RS | 1332 U | 8/2013 |
| WO | 2005002278 | 1/2005 |
| WO | 2009044357 | 4/2009 |
| WO | 2012/059385 | 5/2012 |
| WO | 2013/006330 | 1/2013 |
| WO | 2013006323 | 1/2013 |
| WO | 2013006338 | 1/2013 |

OTHER PUBLICATIONS

Stanojevic, Tomislav et al. "Designing of TSS Halls," 13th International Congress on Acoustics, Yugoslavia, 1989, pp. 326-331.
Stanojevic, Tomislav et al. "The Total Surround Sound (TSS) Processor," SMPTE Journal, Nov. 1994, pp. 734-740.
Stanojevic, Tomislav et al. "The Total Surround Sound System (TSS System)", 86th AES Convention, Hamburg, Germany, Mar. 7-10, 1989, 21 pages.
Stanojevic, Tomislav et al. "TSS System and Live Performance Sound" 88th AES Convention, Montreux, Switzerland, Mar. 13-16, 1990, 27 pages.
Stanojevic, Tomislav et al. "TSS Processor" 135th SMPTE Technical Conference, Los Angeles Convention Center, Los Angeles, California, Society of Motion Picture and Television Engineers, Oct. 29-Nov. 2, 1993, 22 pages.
Stanojevic, Tomislav "3-D Sound in Future HDTV Projection Systems," 132nd SMPTE Technical Conference, Jacob K. Javits Convention Center, New York City, New York, Oct. 13-17, 1990, 20 pages.
Stanojevic, Tomislav "Surround Sound for a New Generation of Theaters," Sound and Video Contractor, Dec. 20, 1995, 7 pages.
Stanojevic, Tomislav "Virtual Sound Sources in the Total Surround Sound System," SMPTE Conf. Proc.,1995, pp. 405-421.
Pulkki, Ville "Compensating Displacement of Amplitude-Panned Virtual Sources," Audio Engineering Society (AES) 22nd International Conference on Virtual, Synthetic and Entertainment Audio, Jun. 2002, Section 2, pp. 3-4.

\* cited by examiner

BASS MANAGEMENT FOR AUDIO RENDERING

CROSS REFERENCE TO RELATED APPLICATIONS

This application claims priority to U.S. Provisional Patent Application No. 61/836,519, filed on 18 Jun. 2013, which is hereby incorporated by reference in its entirety.

TECHNICAL FIELD

This disclosure relates to processing audio data. In particular, this disclosure relates to processing low-frequency audio data for sound reproduction systems.

BACKGROUND

Since the introduction of sound with film in 1927, there has been a steady evolution of technology used to capture the artistic intent of the motion picture sound track and to reproduce this content. In the 1970s Dolby introduced a cost-effective means of encoding and distributing mixes with 3 screen channels and a mono surround channel. Dolby brought digital sound to the cinema during the 1990s with a 5.1 channel format that provides discrete left, center and right screen channels, left and right surround arrays and a subwoofer channel for low-frequency effects. Dolby Surround 7.1, introduced in 2010, increased the number of surround channels by splitting the existing left and right surround channels into four "zones."

Both cinema and home theater audio reproduction systems are becoming increasingly versatile and complex. Home theater audio reproduction systems are including increasing numbers of speakers. As the number of channels increases and the loudspeaker layout transitions from a planar two-dimensional (2D) array to a three-dimensional (3D) array including elevation, reproducing sounds in a playback environment is becoming an increasingly complex process. Improved audio processing methods would be desirable.

SUMMARY

Improved and efficient methods for processing low-frequency audio data are provided. Some aspects of the subject matter described in this disclosure can be implemented in tools for rendering audio objects. As used herein, the term "audio object" refers to audio signals (referred to herein as "audio object signals") and associated metadata that may be created or "authored" without reference to any particular playback environment. The associated metadata may include audio object position data, audio object gain data, audio object size data, audio object trajectory data, etc. As used herein, the term "rendering" refers to a process of transforming audio objects into speaker feed signals for a particular playback environment. A rendering process may be performed, at least in part, according to the associated metadata and according to playback environment data. The playback environment data may include an indication of a number of speakers in a playback environment and an indication of the location of each speaker within the playback environment. The playback environment data also may include an indication of one or more speakers capable of reproducing low-frequency audio signals.

According to some implementations described herein, a bass extraction process may involve applying low-pass filters to received audio object signals, to produce extracted low-frequency audio signals. The bass extraction process may be performed prior to a process of rendering audio objects into speaker feed signals. A bass management process may involve routing the extracted low-frequency audio signals to the one or more speakers capable of reproducing low-frequency audio signals.

Some bass management methods provided herein may be implemented when processing channel-based audio data. For example, Dolby has recently developed channel-based audio rendering systems capable of implementing array processing methods to received "legacy" channel-based audio data, such as Dolby Surround 5.1 or Dolby Surround 7.1 audio data. If an array processing method uses a power equivalent level and duplicates signals in phase into a nearby speaker, bass build-up may result. However, if a bass extraction process is performed prior to such an array processing method, bass build-up may be mitigated or avoided.

According to some implementations described herein, a method may involve receiving audio data including audio objects. The audio objects may include audio object signals and associated metadata. The associated metadata may include positional metadata for the audio objects. The method may involve applying a bass extraction process involving low-pass filters to the audio object signals, to produce extracted low-frequency audio signals. The method may involve receiving playback environment data. The playback environment data may include an indication of a number of speakers in a playback environment, an indication of the location of each speaker within the playback environment and an indication of one or more speakers capable of reproducing low-frequency audio signals.

The method may involve rendering, after the bass extraction process, audio signals for the audio objects into one or more speaker feed signals based, at least in part, on the playback environment data and the associated metadata. Each speaker feed signal may correspond to at least one of the speakers of the playback environment. The method may involve performing a bass management process on the extracted low-frequency audio signals. The bass management process may involve routing the extracted low-frequency audio signals to the one or more speakers capable of reproducing low-frequency audio signals.

The bass management process may involve limiting amplitudes of at least some low-frequency audio signals. The bass management process may involve combining the extracted low-frequency audio signals and the speaker feed signals.

The audio data may include audio bed signals corresponding to speaker locations. The applying process may involve applying a bass extraction process to at least some of the audio bed signals.

The method may involve applying an upmix or a downmix process to audio bed signals. The upmix or downmix process may be based, at least in part, on the number of speakers in the playback environment. According to some implementations, the audio data may be received and processed by an upmix including speaker array processing.

The method may involve pre-processing the audio data before applying the bass extraction process. The pre-processing may involve applying a gain according to at least one of the audio object metadata or the playback environment data.

The audio data may include sound field representation data. The method may involve applying a bass extraction process and a high-pass filter to different copies of a first portion of the sound field representation data. The method may involve applying a high-pass filter, but not applying a bass extraction process, to different copies of a second portion of the sound field representation data. The high pass filters applied to the first portion and the second portion of the sound field representation data may or may not be the same high pass filter.

In some implementations, the audio data may be received from a decoder. Alternatively, or additionally, the audio data may be received as a pulse-code modulation stream or as a similar data stream.

In some implementations, the received audio data may include a low-frequency effect audio channel. The base management process may involve mixing the extracted low-frequency audio signals with low-frequency effect audio data of the low-frequency effect audio channel. The method may involve leveling the extracted low-frequency audio signals with the low-frequency effect audio channel before mixing. The leveling process may involve amplifying the low-frequency effect audio data and/or attenuating the extracted low-frequency audio signals.

The method may involve applying a high-pass filter to at least some of the audio object signals to produce high-pass filtered audio signals. The rendering process may involve rendering the high-pass filtered audio signals into one or more high-pass filtered speaker feed signals.

Various implementations disclosed herein may be implemented, at least in part, via a non-transitory medium having software stored thereon. The software may include instructions for controlling at least one apparatus to receive audio data including audio objects. The audio objects may include audio object signals and associated metadata, such as positional metadata for the audio objects.

The software may include instructions for controlling at least one apparatus to apply a bass extraction process involving low-pass filters to the audio object signals, to produce extracted low-frequency audio signals. The software may include instructions for controlling at least one apparatus to receive playback environment data. The playback environment data may include an indication of a number of speakers in a playback environment, an indication of the location of each speaker within the playback environment and an indication of one or more speakers capable of reproducing low-frequency audio signals. The software may include instructions for controlling at least one apparatus to render, after the bass extraction process, audio signals for the audio objects into one or more speaker feed signals based, at least in part, on the playback environment data and the associated metadata including positional metadata. Each speaker feed signal may correspond to at least one of the speakers of the playback environment.

The software may include instructions for controlling at least one apparatus to perform a bass management process on the extracted low-frequency audio signals. The bass management process may involve routing the extracted low-frequency audio signals to the one or more speakers capable of reproducing low-frequency audio signals.

In some implementations, the bass management process may involve limiting amplitudes of at least some low-frequency audio signals. The bass management process may involve combining the extracted low-frequency audio signals and the speaker feed signals.

The audio data may include audio bed signals corresponding to speaker locations. The applying process may involve applying a bass extraction process to at least some of the audio bed signals.

The software may include instructions for controlling the at least one apparatus to apply an upmix or a downmix process to audio bed signals. The upmix or downmix process may be based, at least in part, on the number of speakers in the playback environment. The audio data may be received and processed by an upmix including speaker array processing.

The software may include instructions for controlling the at least one apparatus to pre-process the audio data before applying the bass extraction process. For example, the pre-processing may involve applying a gain according to at least one of the audio object metadata or the playback environment data.

In some implementations, the audio data may include sound field representation data. The software may include instructions for controlling the at least one apparatus to apply a bass extraction process and a high-pass filter to different copies of a first portion of the sound field representation data. The software may include instructions for controlling the at least one apparatus to apply a high-pass filter, but not to apply a bass extraction process, to different copies of a second portion of the sound field representation data. In some implementations, the high pass filters applied to the first portion and the second portion of the sound field representation data may or may not be the same high pass filter.

In some implementations, the audio data may be received from a decoder. Alternatively, or additionally, the audio data may be received as a pulse-code modulation stream or as a similar data stream.

The received audio data may include a low-frequency effect audio channel. The base management process may involve mixing the extracted low-frequency audio signals with low-frequency effect audio data of the low-frequency effect audio channel.

The software may include instructions for controlling the at least one apparatus to level the extracted low-frequency audio signals with the low-frequency effect audio channel before mixing. The leveling process may involve amplifying the low-frequency effect audio data and/or attenuating the extracted low-frequency audio signals.

The software may include instructions for controlling the at least one apparatus to apply a high-pass filter to at least some of the audio object signals, to produce high-pass filtered audio signals. The rendering process may involve rendering the high-pass filtered audio signals into one or more high-pass filtered speaker feed signals.

Some implementations described herein may be provided, at least in part, by an apparatus that includes an interface and a logic system. The logic system may include at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components. The apparatus may include a memory device. The interface may include an interface between the logic system and the memory device. Alternatively, or additionally, the interface may include a network interface.

The logic system may be capable of receiving audio data including audio objects. The audio objects may include audio object signals and associated metadata, such as positional metadata for the audio objects. The logic system may be capable of applying a bass extraction process involving low-pass filters to the audio object signals, to produce extracted low-frequency audio signals.

The logic system may be capable of receiving playback environment data. The playback environment data may include an indication of a number of speakers in a playback environment, an indication of the location of each speaker within the playback environment and an indication of one or more speakers capable of reproducing low-frequency audio signals.

The logic system may be capable of rendering, after the bass extraction process, audio signals for the audio objects into one or more speaker feed signals based, at least in part, on the playback environment data and the associated metadata. Each speaker feed signal may correspond to at least one of the speakers of the playback environment.

The logic system may be capable of performing a bass management process on the extracted low-frequency audio signals. The bass management process may involve routing the extracted low-frequency audio signals to the one or more speakers capable of reproducing low-frequency audio signals. The bass management process may involve limiting amplitudes of at least some low-frequency audio signals. The bass management process may involve combining the extracted low-frequency audio signals and the speaker feed signals.

The audio data may include audio bed signals corresponding to speaker locations. The applying process may involve applying a bass extraction process to at least some of the audio bed signals.

The logic system may be capable of applying an upmix or a downmix process to audio bed signals. The upmix or downmix process may be based, at least in part, on the number of speakers in the playback environment. The audio data may be received and processed by an upmix including speaker array processing.

The logic system may be further capable of pre-processing the audio data before applying the bass extraction process. For example, the pre-processing may involve applying a gain according to at least one of the audio object metadata or the playback environment data.

The audio data may include sound field representation data. The logic system may be capable of applying a bass extraction process and a high-pass filter to different copies of a first portion of the sound field representation data. The logic system may be configured for applying a high-pass filter, but not applying a bass extraction process, to different copies of a second portion of the sound field representation data. The high pass filters applied to the first portion and the second portion of the sound field representation data may or may not be the same high pass filter.

In some implementations, the audio data may be received from a decoder. Alternatively, or additionally, the audio data may be received as a pulse-code modulation stream.

The received audio data may include a low-frequency effect audio channel. The base management process may involve mixing the extracted low-frequency audio signals with low-frequency effect audio data of the low-frequency effect audio channel. The logic system may be further capable of leveling the extracted low-frequency audio signals with the low-frequency effect audio channel before mixing. The leveling process may involve amplifying the low-frequency effect audio data and/or attenuating the extracted low-frequency audio signals.

The logic system may be further capable of applying a high-pass filter to at least some of the audio object signals, to produce high-pass filtered audio signals. The rendering process may involve rendering the high-pass filtered audio signals into one or more high-pass filtered speaker feed signals.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DESCRIPTION OF EXAMPLE EMBODIMENTS

The following description is directed to certain implementations for the purposes of describing some innovative aspects of this disclosure, as well as examples of contexts in which these innovative aspects may be implemented. However, the teachings herein can be applied in various different ways. For example, while various implementations have been described in terms of particular playback environments, the teachings herein are widely applicable to other known playback environments, as well as playback environments that may be introduced in the future. Moreover, the described implementations may be implemented, at least in part, in various devices and systems as hardware, software, firmware, cloud-based systems, etc. Accordingly, the teachings of this disclosure are not intended to be limited to the implementations shown in the figures and/or described herein, but instead have wide applicability.

Figure 1:
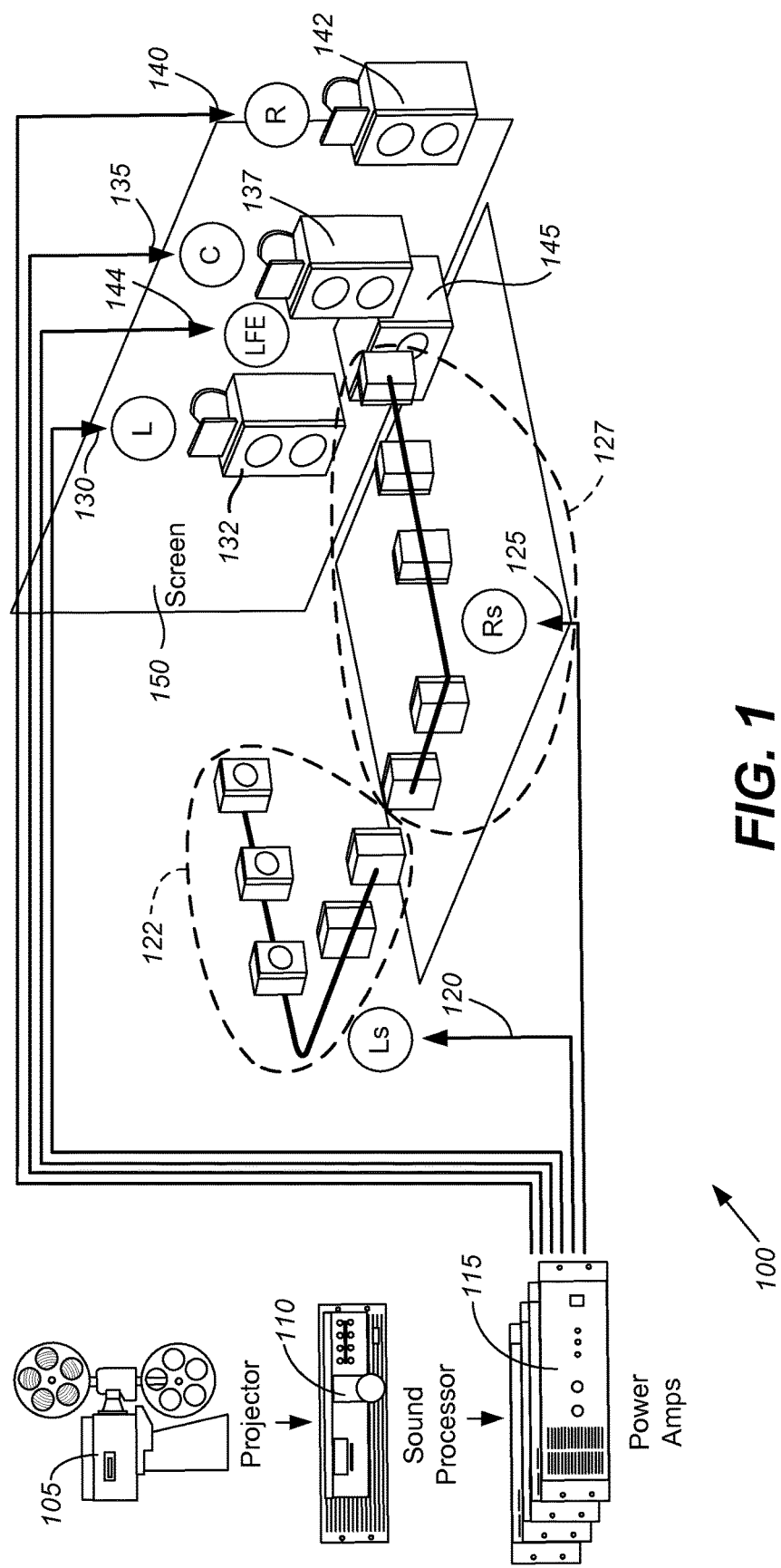
FIG. 1 shows an example of a playback environment having a Dolby Surround 5.1 configuration.

FIG. 1 shows an example of a playback environment having a Dolby Surround 5.1 configuration. In this example, the playback environment is a cinema playback environment. Dolby Surround 5.1 was developed in the 1990s, but this configuration is still widely deployed in home and cinema playback environments. In a cinema playback environment, a projector 105 may be configured to project video images, e.g. for a movie, on a screen 150. Audio data may be synchronized with the video images and processed by the sound processor 110. The power amplifiers 115 may provide speaker feed signals to speakers of the playback environment 100.

The Dolby Surround 5.1 configuration includes a left surround channel 120 for the left surround array 122 and a right surround channel 125 for the right surround array 127. The Dolby Surround 5.1 configuration also includes a left channel 130 for the left speaker array 132, a center channel 135 for the center speaker array 137 and a right channel 140 for the right speaker array 142. In a cinema environment, these channels may be referred to as a left screen channel, a center screen channel and a right screen channel, respectively. A separate low-frequency effects (LFE) channel 144 is provided for the subwoofer 145.

Figure 2:
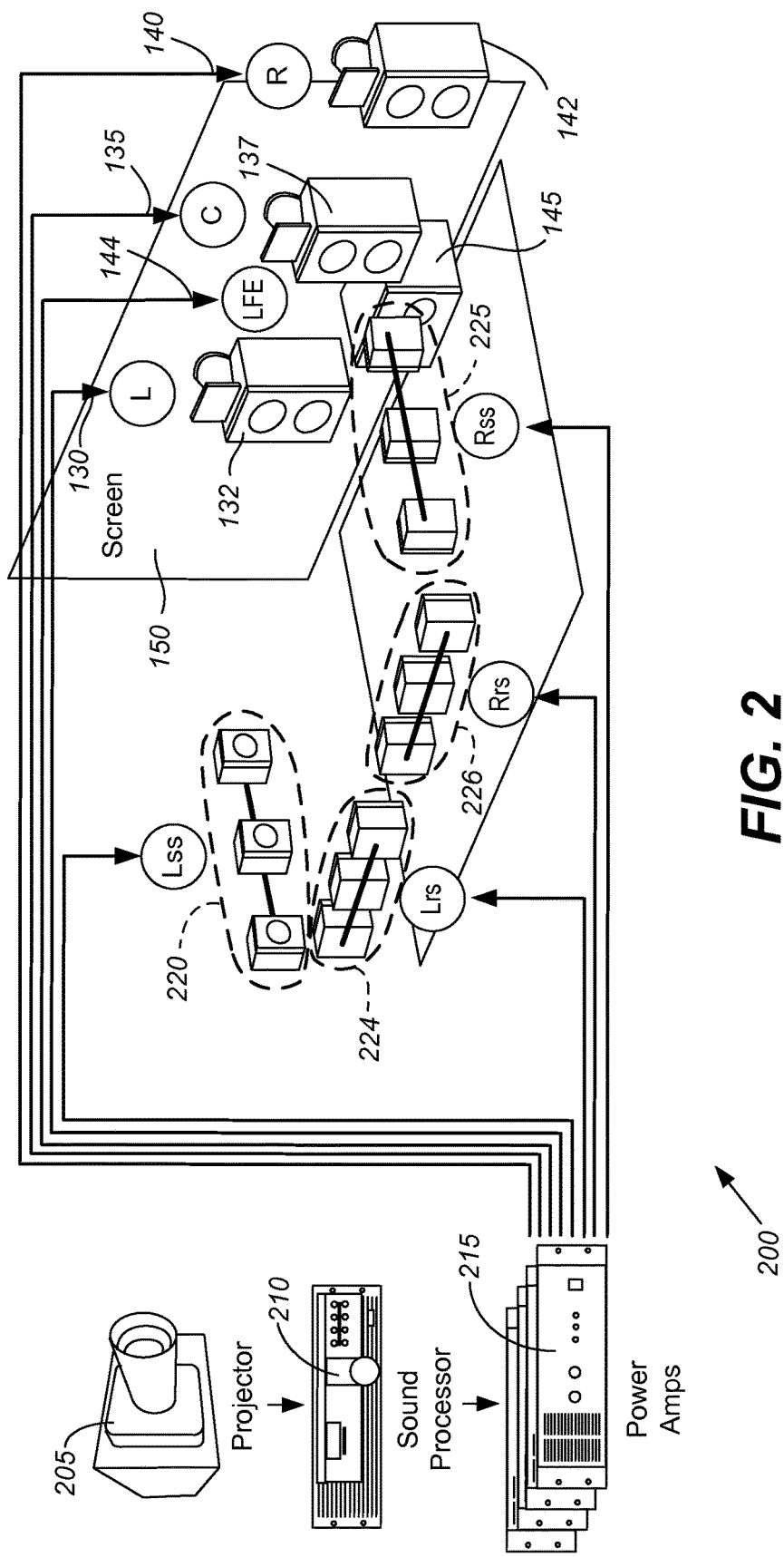
FIG. 2 shows an example of a playback environment having a Dolby Surround 7.1 configuration.

In 2010, Dolby provided enhancements to digital cinema sound by introducing Dolby Surround 7.1. FIG. 2 shows an example of a playback environment having a Dolby Surround 7.1 configuration. A digital projector 205 may be configured to receive digital video data and to project video images on the screen 150. Audio data may be processed by the sound processor 210. The power amplifiers 215 may provide speaker feed signals to speakers of the playback environment 200.

Like Dolby Surround 5.1, the Dolby Surround 7.1 configuration includes a left channel 130 for the left speaker array 132, a center channel 135 for the center speaker array 137, a right channel 140 for the right speaker array 142 and an LFE channel 144 for the subwoofer 145. The Dolby Surround 7.1 configuration includes a left side surround (Lss) array 220 and a right side surround (Rss) array 225, each of which may be driven by a single channel.

However, Dolby Surround 7.1 increases the number of surround channels by splitting the left and right surround channels of Dolby Surround 5.1 into four zones: in addition to the left side surround array 220 and the right side surround array 225, separate channels are included for the left rear surround (Lrs) speakers 224 and the right rear surround (Rrs) speakers 226. Increasing the number of surround zones within the playback environment 200 can significantly improve the localization of sound.

In an effort to create a more immersive environment, some playback environments may be configured with increased numbers of speakers, driven by increased numbers of channels. Moreover, some playback environments may include speakers deployed at various elevations, some of which may be "height speakers" configured to produce sound from an area above a seating area of the playback environment.

Figure 3A:
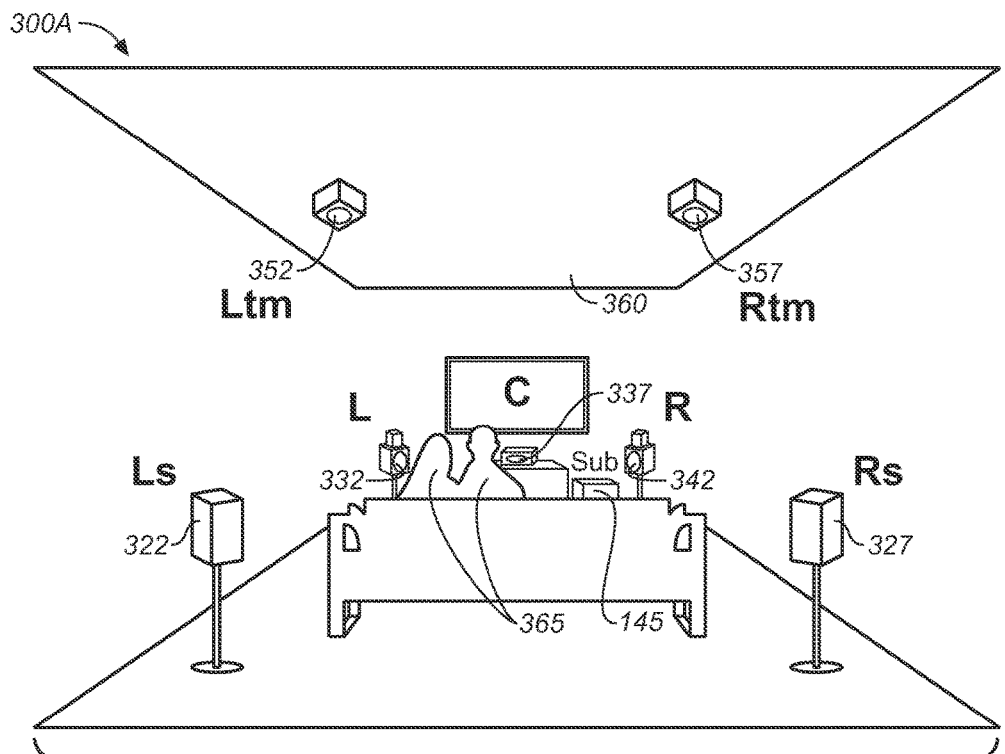
FIGS. 3A and 3B illustrate two examples of home theater playback environments that include height speaker configurations.
Figure 3B:
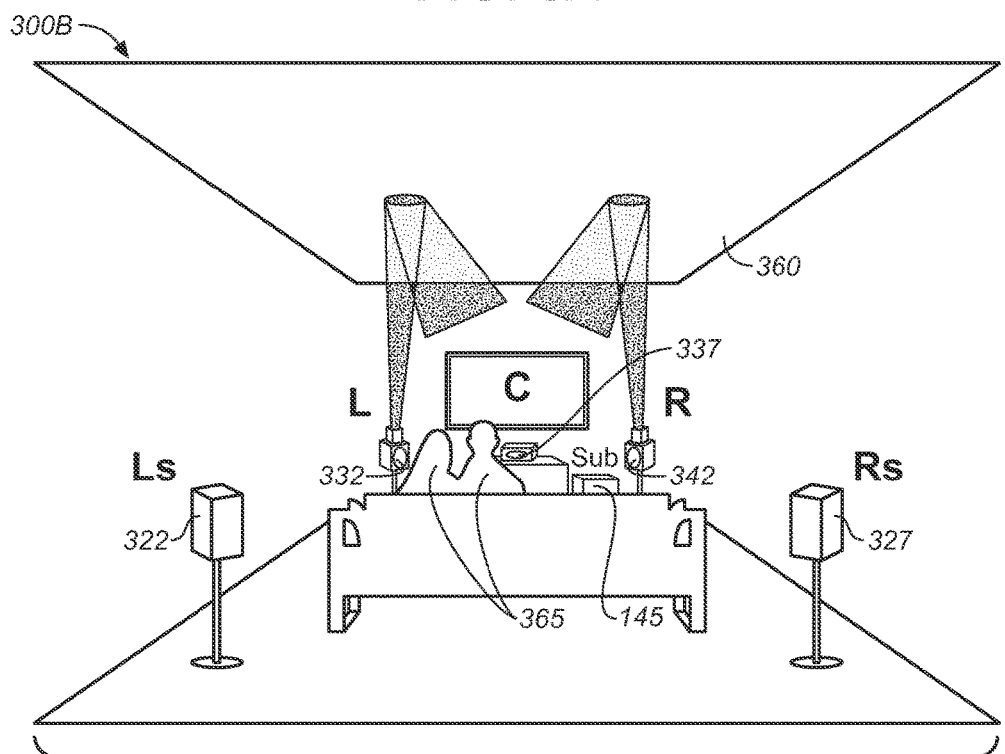

FIGS. 3A and 3B illustrate two examples of home theater playback environments that include height speaker configurations. In these examples, the playback environments 300a and 300b include the main features of a Dolby Surround 5.1 configuration, including a left surround speaker 322, a right surround speaker 327, a left speaker 332, a right speaker 342, a center speaker 337 and a subwoofer 145. However, the playback environment 300 includes an extension of the Dolby Surround 5.1 configuration for height speakers, which may be referred to as a Dolby Surround 5.1.2 configuration.

FIG. 3A illustrates an example of a playback environment having height speakers mounted on a ceiling 360 of a home theater playback environment. In this example, the playback environment 300a includes a height speaker 352 that is in a left top middle (Ltm) position and a height speaker 357 that is in a right top middle (Rtm) position. In the example shown in FIG. 3B, the left speaker 332 and the right speaker 342 are Dolby Elevation speakers that are configured to reflect sound from the ceiling 360. If properly configured, the reflected sound may be perceived by listeners 365 as if the sound source originated from the ceiling 360. However, the number and configuration of speakers is merely provided by way of example. Some current home theater implementations provide for up to 34 speaker positions, and contemplated home theater implementations may allow yet more speaker positions.

Accordingly, the modern trend is to include not only more speakers and more channels, but also to include speakers at differing heights. As the number of channels increases and the speaker layout transitions from 2D to 3D, the tasks of positioning and rendering sounds becomes increasingly difficult.

Accordingly, Dolby has developed various tools, including but not limited to user interfaces, which increase functionality and/or reduce authoring complexity for a 3D audio sound system. Some such tools may be used to create audio objects and/or metadata for audio objects.

Figure 4A:
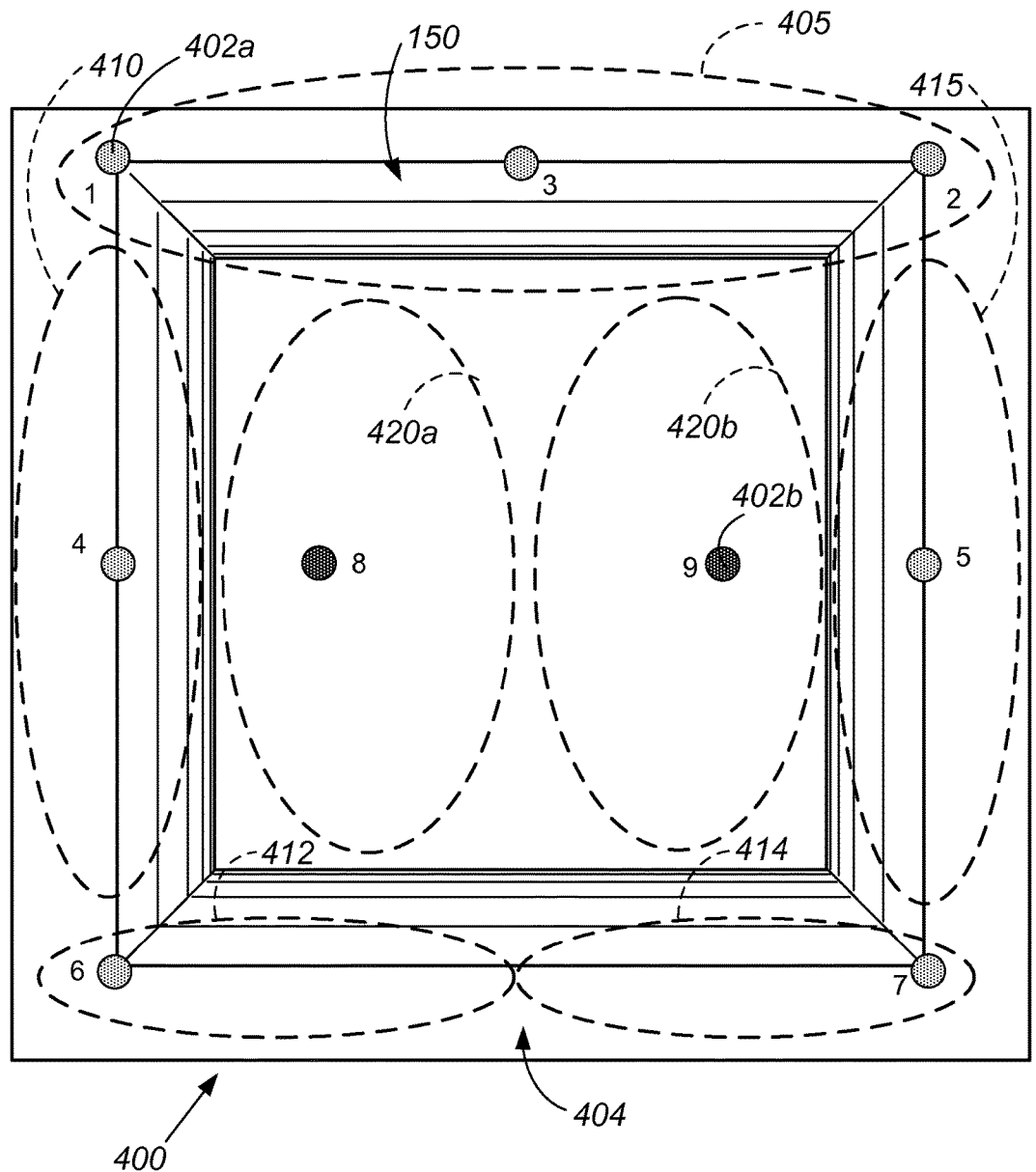
FIG. 4A shows an example of a graphical user interface (GUI) that portrays speaker zones at varying elevations in a virtual playback environment.

FIG. 4A shows an example of a graphical user interface (GUI) that portrays speaker zones at varying elevations in a virtual playback environment. GUI 400 may, for example, be displayed on a display device according to instructions from a logic system, according to signals received from user input devices, etc. Some such devices are described below with reference to FIG. 11.

As used herein with reference to virtual playback environments such as the virtual playback environment 404, the term "speaker zone" generally refers to a logical construct that may or may not have a one-to-one correspondence with a speaker of an actual playback environment. For example, a "speaker zone location" may or may not correspond to a particular speaker location of a cinema playback environment. Instead, the term "speaker zone location" may refer generally to a zone of a virtual playback environment. In some implementations, a speaker zone of a virtual playback environment may correspond to a virtual speaker, e.g., via the use of virtualizing technology such as Dolby Headphone,™ (sometimes referred to as Mobile Surround™), which creates a virtual surround sound environment in real time using a set of two-channel stereo headphones. In GUI 400, there are seven speaker zones 402a at a first elevation and two speaker zones 402b at a second elevation, making a total of nine speaker zones in the virtual playback environment 404. In this example, speaker zones 1-3 are in the front area 405 of the virtual playback environment 404. The front area 405 may correspond, for example, to an area of a cinema playback environment in which a screen 150 is located, to an area of a home in which a television screen is located, etc.

Here, speaker zone 4 corresponds generally to speakers in the left area 410 and speaker zone 5 corresponds to speakers in the right area 415 of the virtual playback environment 404. Speaker zone 6 corresponds to a left rear area 412 and speaker zone 7 corresponds to a right rear area 414 of the virtual playback environment 404. Speaker zone 8 corresponds to speakers in an upper area 420a and speaker zone 9 corresponds to speakers in an upper area 420b, which may be a virtual ceiling area. Accordingly, the locations of speaker zones 1-9 that are shown in FIG. 4A may or may not correspond to the locations of speakers of an actual playback environment. Moreover, other implementations may include more or fewer speaker zones and/or elevations.

In various implementations described herein, a user interface such as GUI 400 may be used as part of an authoring tool and/or a rendering tool. In some implementations, the authoring tool and/or rendering tool may be implemented via software stored on one or more non-transitory media. The authoring tool and/or rendering tool may be implemented (at least in part) by hardware, firmware, etc., such as the logic system and other devices described below with reference to FIG. 11. In some authoring implementations, an associated authoring tool may be used to create metadata for associated audio data. The metadata may, for example, include data indicating the position and/or trajectory of an audio object in a three-dimensional space, speaker zone constraint data, etc. The metadata may be created with respect to the speaker zones 402 of the virtual playback environment 404, rather than with respect to a particular speaker layout of an actual playback environment. A rendering tool may receive audio data and associated metadata, and may compute audio gains and speaker feed signals for a playback environment. Such audio gains and speaker feed signals may be computed according to an amplitude panning process, which can create a perception that a sound is coming from a position P in the playback environment. For example, speaker feed signals may be provided to speakers 1 through N of the playback environment according to the following equation:

$$x_i(t) = g_i x(t), i=1, \ldots N \quad \text{(Equation 1)}$$

In Equation 1, $x_i(t)$ represents the speaker feed signal to be applied to speaker i, $g_i$ represents the gain factor of the corresponding channel, $x(t)$ represents the audio signal and t represents time. The gain factors may be determined, for example, according to the amplitude panning methods described in Section 2, pages 3-4 of V. Pulkki, *Compensating Displacement of Amplitude-Panned Virtual Sources* (Audio Engineering Society (AES) International Conference on Virtual, Synthetic and Entertainment Audio), which is hereby incorporated by reference. In some implementations, the gains may be frequency dependent. In some implementations, a time delay may be introduced by replacing $x(t)$ by $x(t-\Delta t)$.

In some rendering implementations, audio reproduction data created with reference to the speaker zones 402 may be mapped to speaker locations of a wide range of playback environments, which may be in a Dolby Surround 5.1 configuration, a Dolby Surround 7.1 configuration, a Hamasaki 22.2 configuration, or another configuration. For example, referring to FIG. 2, a rendering tool may map audio reproduction data for speaker zones 4 and 5 to the left side surround array 220 and the right side surround array 225 of a playback environment having a Dolby Surround 7.1 configuration. Audio reproduction data for speaker zones 1, 2 and 3 may be mapped to the left screen channel 230, the right screen channel 240 and the center screen channel 235, respectively. Audio reproduction data for speaker zones 6 and 7 may be mapped to the left rear surround speakers 224 and the right rear surround speakers 226.

Figure 4B:
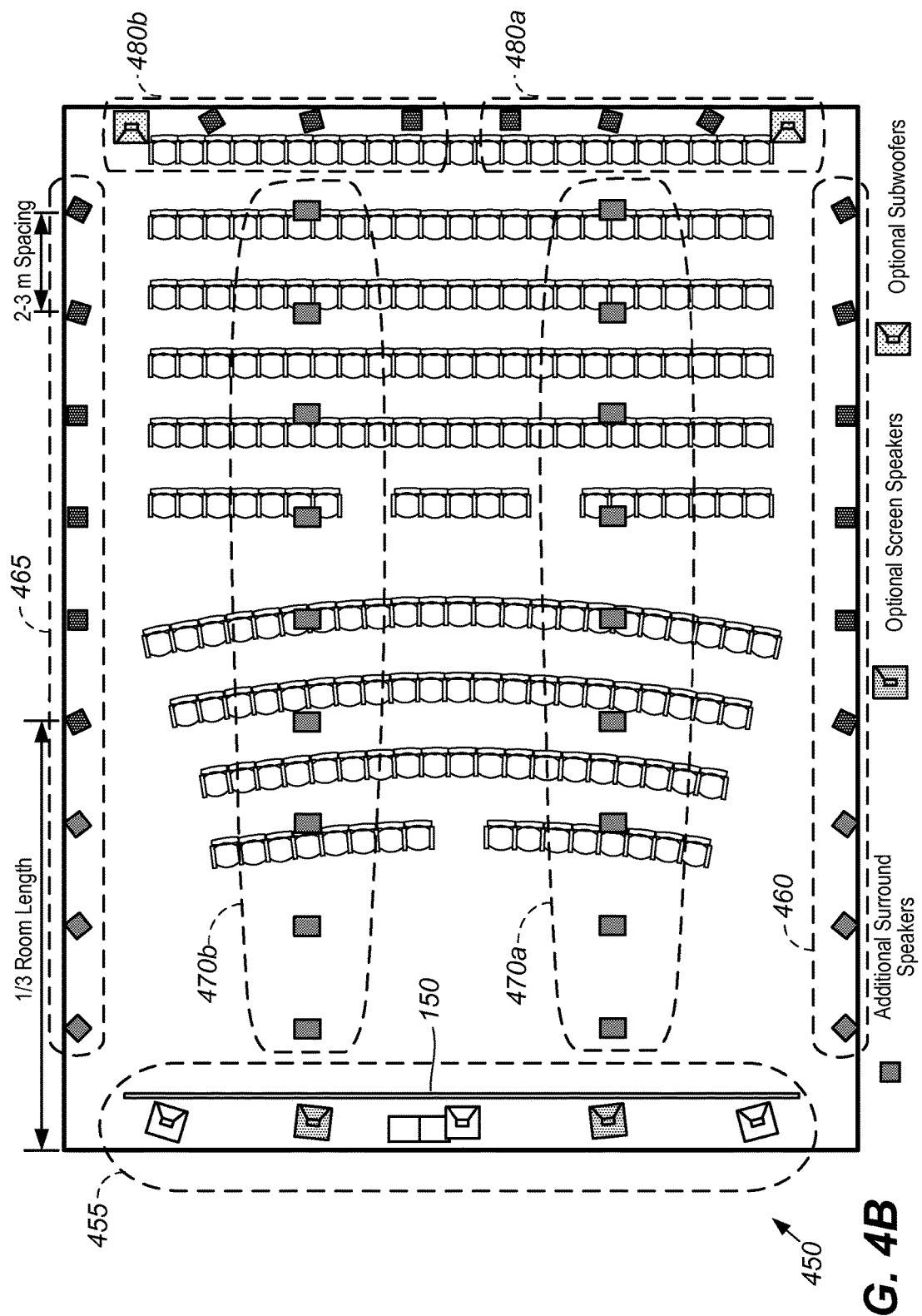
FIG. 4B shows an example of another playback environment.

FIG. 4B shows an example of another playback environment. In some implementations, a rendering tool may map audio reproduction data for speaker zones 1, 2 and 3 to corresponding screen speakers 455 of the playback environment 450. A rendering tool may map audio reproduction data for speaker zones 4 and 5 to the left side surround array 460 and the right side surround array 465 and may map audio reproduction data for speaker zones 8 and 9 to left overhead speakers 470a and right overhead speakers 470b. Audio reproduction data for speaker zones 6 and 7 may be mapped to left rear surround speakers 480a and right rear surround speakers 480b.

In some authoring implementations, an authoring tool may be used to create metadata for audio objects. The metadata may indicate the 3D position of the object, rendering constraints as well as content type (e.g. dialog, effects, etc.). Depending on the implementation, the metadata may include other types of data, such as width data, gain data, trajectory data, etc. Some audio objects may be static, whereas others may move.

Audio objects are rendered according to their associated metadata which includes positional metadata indicating the position of the audio object in a three-dimensional space at a given point in time. When audio objects are monitored or played back in a playback environment, the audio objects are rendered according to the positional metadata using the speakers that are present in the playback environment, rather than being output to a predetermined physical channel, as is the case with traditional, channel-based systems such as Dolby 5.1 and Dolby 7.1.

In traditional, channel-based systems, the management of low-frequency or "bass" audio signals occurs near the end of the playback processing sequence because bass processing is generally specific to the output configuration of the product and of the playback environment. The low frequencies may be statically routed through a cross-over network and reproduced by full-range speaker outputs. Two common bass management configurations are outlined in the following table:

| | |
|---|---|
| Configuration 1 | All speaker outputs (except sub) are high-pass filtered Low frequencies are redirected to the subwoofer output along with the LFE channel |
| Configuration 2 | Left and Right speakers are full-range There is no subwoofer All other speakers are high-pass filtered Low frequencies are redirected to the Left and Right outputs |

With audio object-based systems and a multitude of possible speaker configurations in playback environments, there is increased complexity and increased risk for bass overload with traditional bass management systems. Specifically, as bass is summed by amplitude, there is the possibility for playing back bass signals at an undesirably high amplitude. This phenomenon, which is sometimes referred to as "bass build-up," can occur when performing an amplitude panning process for a moving audio object.

Figure 5:
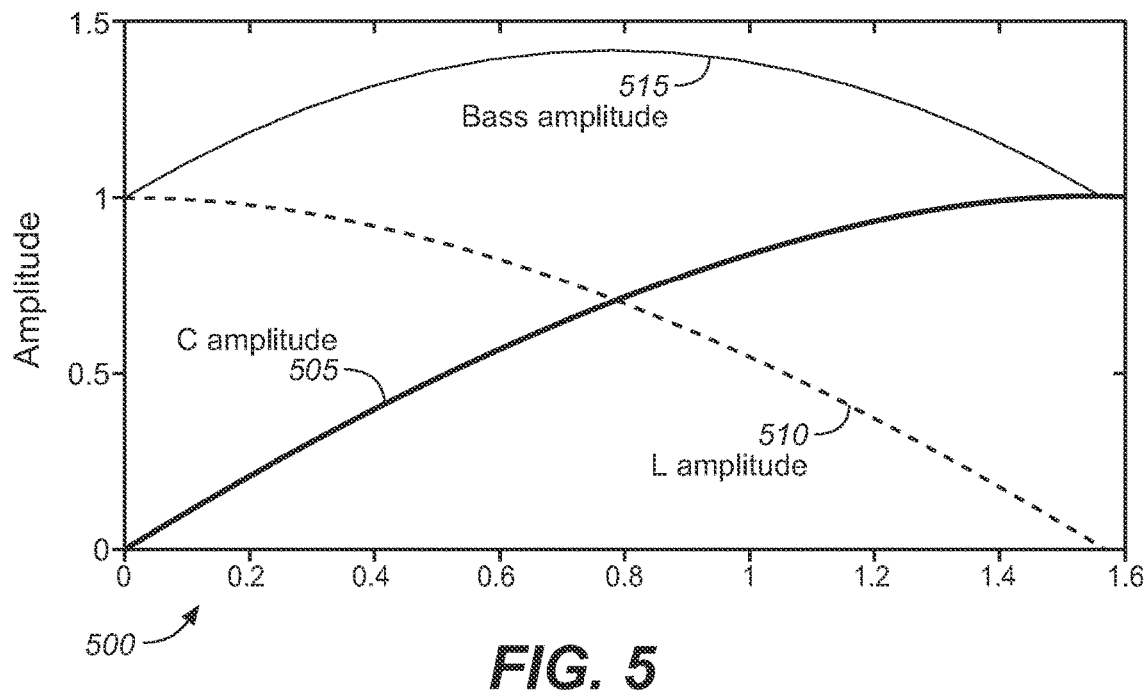
FIG. 5 is a graph that provides an example of bass build-up when performing an amplitude panning process for an audio object that moves from a left speaker position to a center speaker position.

FIG. 5 is a graph that provides an example of bass build-up when performing an amplitude panning process for an audio object that moves from a left speaker position to a center speaker position. In graph 500, the curve 505 represents the amplitude of the center speaker at each panning position and the curve 510 represents the amplitude of the left speaker at each panning position. The curve 515 represents the bass amplitude at each panning position. Because the bass amplitudes are summed at each panning position, the bass amplitude of the audio object reaches a maximum amplitude of 3 dB greater than the proper level.

Figure 6:
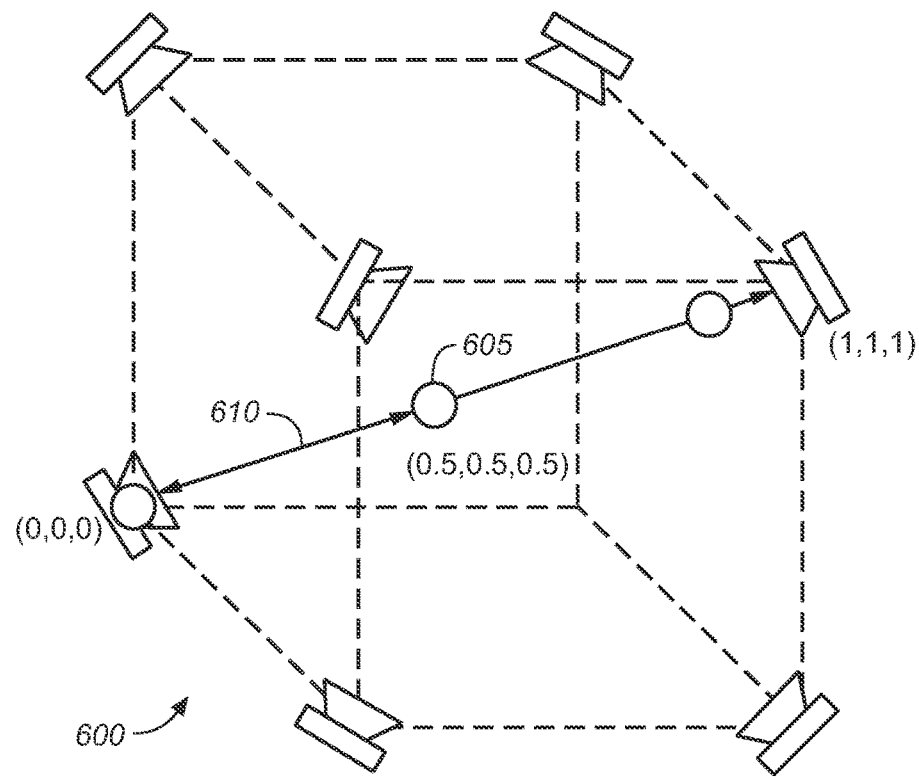
FIG. 6 illustrates a playback environment having a speaker in each corner of a cube.

More extreme examples of bass buildup can occur in a three-dimensional playback environment. FIG. 6 illustrates a playback environment having a speaker in each corner of a cube. In this example, the lower left corner of playback environment 600 has (x,y,z) coordinates (0,0,0), the upper right corner of playback environment 600 has coordinates (1,1,1) and the center has coordinates (0.5,0.5,0.5). In FIG.

6, the audio object is shown moving along a line that extends from (0,0,0) to (1,1,1). When an amplitude panning process is performed on an audio object located in the center of the playback environment 600, at (0.5,0.5,0.5), there may be contributions from all of the speakers in the playback environment 600 and the bass build-up may be greater than 9 dB.

Figure 7A:
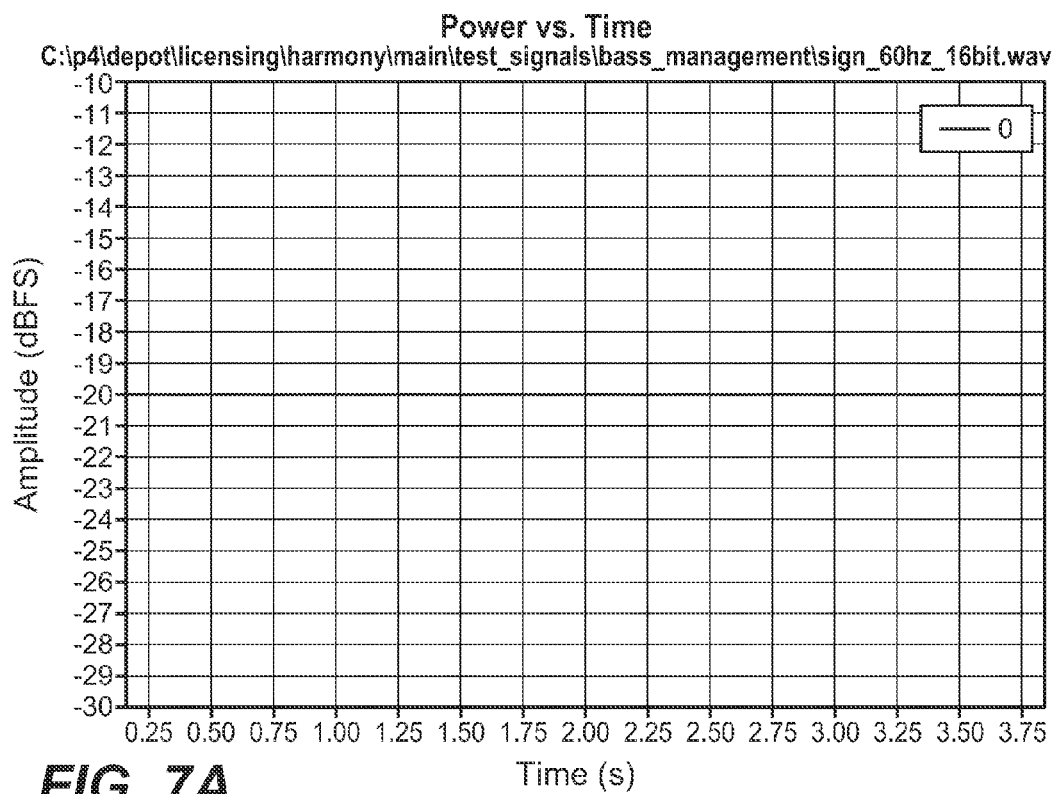
FIG. 7A indicates the amplitude of a broadband input signal over time.
Figure 7B:
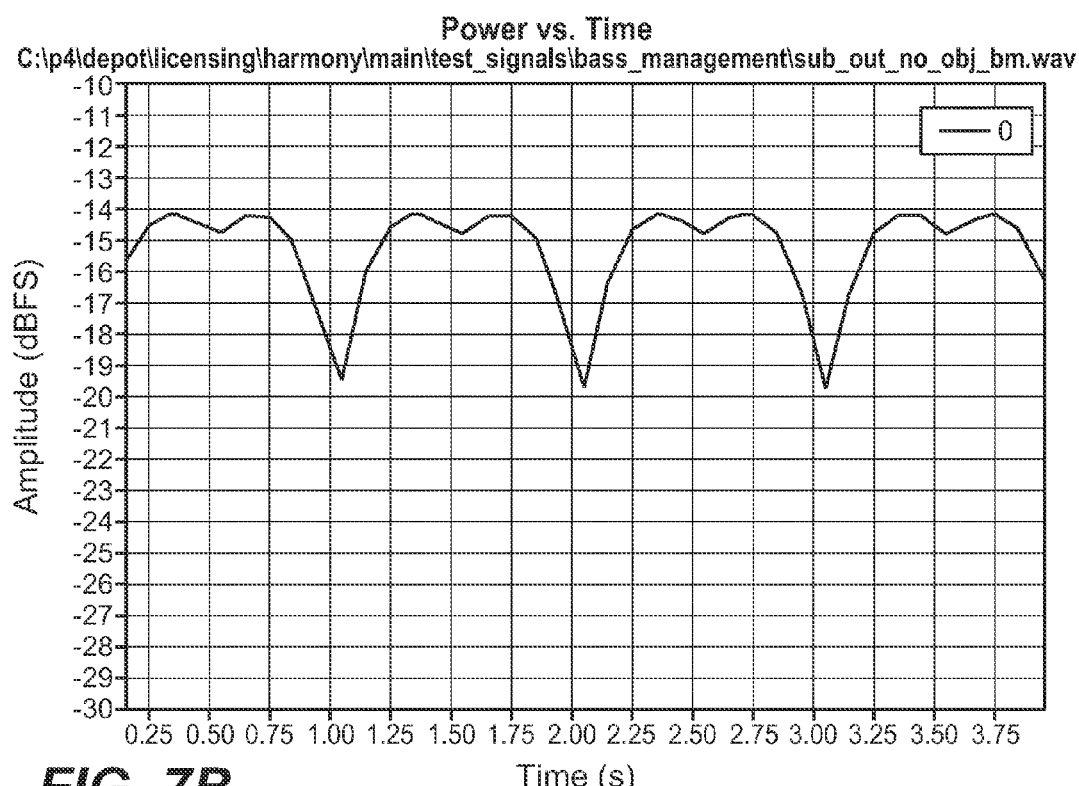
FIG. 7B indicates the bass build-up in a subwoofer signal, resulting from the input signal shown in FIG. 7A, for an audio object panning between a corner and the center of a playback environment four times.

FIG. 7A indicates the amplitude of a broadband input signal over time. FIG. 7B indicates the bass build-up in a subwoofer signal, resulting from the input signal shown in FIG. 7A, for an audio object panning between a corner and the center of a playback environment four times. In this example, playback environment has a Dolby 5.1.2 speaker configuration (including L, R, C, Ls, Rs, Ltm and Rtm speakers, and a subwoofer), similar to that shown in FIG. 3A and described above. As shown in FIG. 7B, the bass build-up in the signal provided to the subwoofer approaches 6 dB.

Bass build-up may occur in other contexts. For example, Dolby has recently developed channel audio rendering systems capable of implementing array processing methods to received "legacy" channel-based audio data, such as Dolby Surround 5.1 or Dolby Surround 7.1 audio data. Such array processing methods also may be referred to herein as "speaker array processing methods." Some array processing methods may involve spreading the audio power of legacy channels to near-by speakers if a playback environment includes non-standard speaker positions and/or includes more output channels than the input channels of the received channel-based audio data. Some such array processing methods may involve duplication of an input audio signal for speakers of the playback environment that are located near a standard speaker location of the legacy channel-based audio data (e.g., near a Left Surround or a Right Surround speaker location of Dolby Surround 5.1).

Some such array processing methods may involve duplication of the input audio signal in phase with the input audio signal and at an equivalent power level. If an array processing method uses a power equivalent level and duplicates signals in phase into a nearby speaker, bass build-up may result. For example, for a Left Surround speaker feed, array processed to nearby speakers (e.g. Left Surround 1, Left Surround 2, etc.), bass build-up may occur if traditional bass management techniques are applied. In a scenario with 4 array-processed speakers, it is expected that there will be a bass build-up of about 6 dB at the bass reproducing output (e.g., in the channel for a subwoofer).

Figure 8:
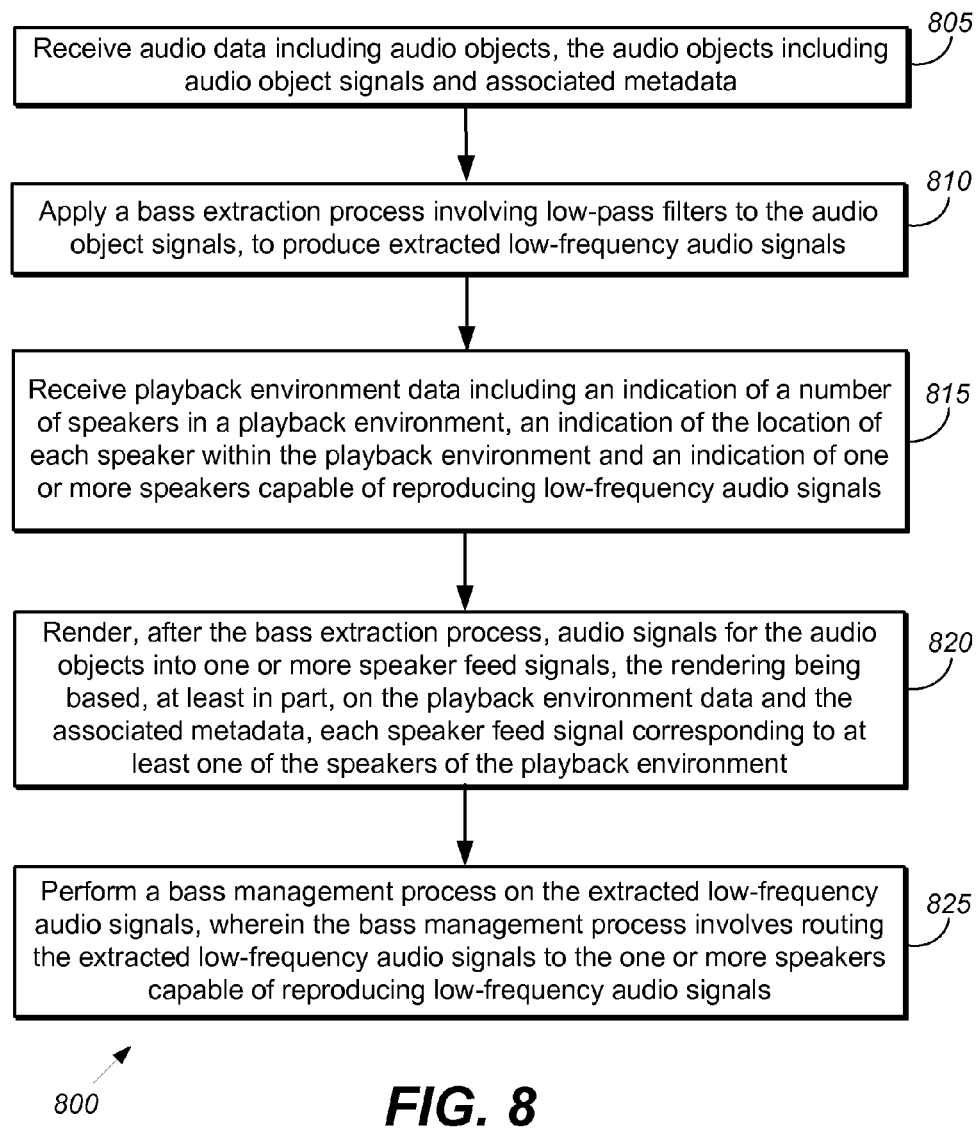
FIG. 8 is a flow diagram that outlines a bass management process for mitigating or eliminating bass build-up.

FIG. 8 is a flow diagram that outlines a bass management process for mitigating or eliminating bass build-up. The operations of method 800, as with other methods described herein, are not necessarily performed in the order indicated. Moreover, these methods may include more or fewer blocks than shown and/or described. These methods may be implemented, at least in part, by a logic system such as the logic system 1110 shown in FIG. 11 and described below. Moreover, such methods may be implemented via a non-transitory medium having software stored thereon. The software may include instructions for controlling one or more devices to perform, at least in part, the methods described herein.

In this example, method 800 begins with block 805, which involves receiving audio data including audio objects. The audio objects include audio object signals and associated metadata. The associated metadata includes positional metadata indicating the position of the audio object in a three dimensional space, and the associated metadata may also include audio object gain information, object position information, audio object size information, etc. In some implementations, block 805 is performed by one or more elements of a system such as those shown in FIGS. 9-11.

Figure 9:
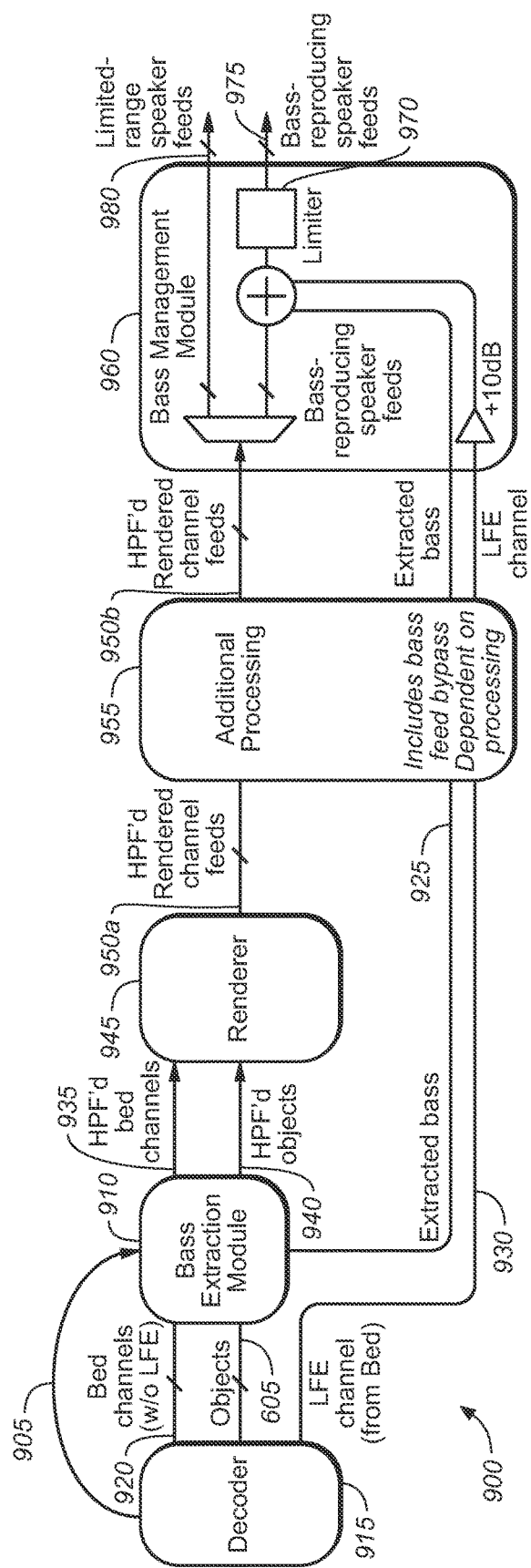
FIG. 9 is a block diagram that depicts one example of an audio processing system.

FIG. 9 is a block diagram that depicts one example of an audio processing system. In this implementation, block 810 of FIG. 8 is performed (at least in part) by a bass extraction module 910 of the audio processing system 900. Here, the bass extraction module 910 receives audio data, including audio objects 605, from the decoder 915. However, in alternative implementations, the decoder 915 may be optional or omitted. For example, the bass extraction module 910 may receive audio data in a format that does not require decoding, e.g., as a pulse-code modulation stream.

Returning to FIG. 8, block 810 involves applying a bass extraction process involving low-pass filters to the audio object signals, to produce extracted low-frequency audio signals. In some implementations, the low-pass filters may pass frequencies below 60 Hz, whereas in other implementation the low-pass filters may pass frequencies below 80 Hz, 100 Hz, 200 Hz, etc. In alternative implementations, the low-pass filters may pass higher or lower frequencies. In the example shown in FIG. 9, in block 810 the bass extraction module 910 applies the bass extraction process to audio object signals corresponding to the received audio objects 605, to produce extracted bass signals 925.

In the example depicted in FIG. 9, the bass extraction module 910 may also receive audio bed signals 920 from the decoder 915 in block 805. Here, the audio bed signals 920 are received as bed channels that correspond to speaker locations. Accordingly, in this implementation block 810 also involves applying a bass extraction process to at least some of the audio bed signals 920.

In the implementation shown in FIG. 9, the bass extraction module 910 may also be configured to apply a high-pass filter to at least some of the audio object signals and the audio bed signals 920. Here, the bass extraction module 910 outputs high-pass filtered audio signals to the renderer 945. In this example, the high-pass filtered audio signals include high-pass filtered bed signals 935 and high-pass filtered audio object signals 940. However, in some alternative implementations, the bass extraction module 910 may not be configured to apply a high-pass filter to the audio object signals and/or the audio bed signals 920.

In this example, block 815 of FIG. 8 involves receiving playback environment data, such as the playback environment data 905 that is received by the renderer 945 in FIG. 9. The playback environment data may include, for example, an indication of a number of speakers in a playback environment, an indication of the location of each speaker within the playback environment and an indication of one or more speakers capable of reproducing low-frequency audio signals.

In this example, block 820 of FIG. 8 involves rendering audio signals for the audio objects into one or more speaker feed signals. Here the rendering process is performed after the bass extraction process and is based, at least in part, on the playback environment data and the metadata associated with the audio objects (including positional metadata). Each speaker feed signal may correspond to at least one of the speakers of the playback environment. In the implementation shown in FIG. 9, block 820 involves rendering high-pass filtered audio object signals 940 into high-pass filtered speaker feed signals 950a.

However, some implementations provided herein do not necessarily involve audio object-based processing, such as the rendering process of block 820. The bass management methods provided herein are not limited to the audio object context, but also may be applied when processing legacy audio data. As noted above, some array processing methods may involve determining that a playback environment is configured for a number of output channels that is different from (e.g., exceeds) the number of input channels. Such methods may involve duplicating an input channel-based audio signal for speakers of a playback environment that are located near a standard speaker location for the channel-based audio data. Some bass management methods provided herein involve applying a bass extraction process prior to the signal duplication process of the array processing method.

Accordingly, the audio processing system 900 may be configured for upmixing or downmixing received audio data, whether processing channel-based audio data or audio bed signals associated with audio objects. The upmixing or downmixing process may be based, at least in part, on the number of speakers in the playback environment. For example, a mixing module of the audio processing system 900 may be configured to receive the playback environment data 905, to determine a number of output channels based on the number of speakers in the playback environment, according to the playback environment data 905, to compare the number of output channels with a number of received input channels and to upmix or downmix audio data for the received input channels accordingly.

In this implementation, block 825 involves performing a bass management process on the extracted low-frequency audio signals. The bass management process may involve routing the extracted low-frequency audio signals to one or more speakers of the playback environment that are capable of reproducing low-frequency audio signals.

In the example shown in FIG. 9, the bass management module 960 is configured to receive the extracted bass signals 925. In this example, bass management module 960 is also configured to receive low frequency effect (LFE) audio data 930 from an LFE channel. Here, the bass management module 960 is also configured for mixing the extracted bass signals 925 with the LFE audio data 930.

FIG. 9 also depicts an optional block 955, which signifies optional additional processing. Such additional processing may involve mitigating reverberation effects, time alignment, equalization, etc. In some implementations, for example, optional block 955 may be configured to receive the high-pass filtered speaker feed signals 950*a*, process these signals and output the high-pass filtered speaker feed signals 950*b*. In some implementations, optional block 955 may be configured to process the extracted bass signals 925 and/or the LFE audio data 930. However, in some implementations there is no optional block 955.

In this implementation, the bass management module 960 is also configured for leveling the extracted bass signals 925 with the LFE audio data 930 before mixing. The leveling process may involve amplifying the LFE audio data 930 and/or attenuating the extracted bass signals 925. In the example shown in FIG. 9, the LFE audio data 930 are amplified by 10 dB. In some implementations, the extracted bass signals 925 and the LFE audio data 930 may be summed together at an acoustically equivalent level prior to final bass management. According to some such implementations, this summation may occur as early as the bass extraction process.

The bass management process also may involve limiting amplitudes of at least some low-frequency audio signals. For example, the bass management module 960 includes a limiter 970 that may be configured to limit amplitudes of the signals that result from combining the LFE audio data 930 and the extracted bass signals 925. Bass-reproducing speaker feeds 975, output from the limiter 970, may be provided to one or more speakers of the playback environment that are capable of reproducing low-frequency audio signals. The bass management module may output high-pass filtered speaker feed signals to one or more speakers of the playback environment that will not be used for reproducing low-frequency audio signals, e.g., as limited-range speaker feed signals 980.

In some implementations, the bass management process of block 825 may involve combining the extracted low-frequency audio signals with speaker feed signals, e.g., those resulting from the rendering process of block 820. Combining these signals may be appropriate for implementations in which the playback environment does not include a subwoofer, such as the playback environment of Configuration 2, above. For example, if the left and right speakers of the playback environment will be the bass playback speakers, the bass management module may combine rendered audio data for the left and right speakers (e.g., corresponding portions of the high-pass filtered speaker feed signals 950*b*) with the LFE audio data 930 and the extracted bass signals 925.

Figure 10:
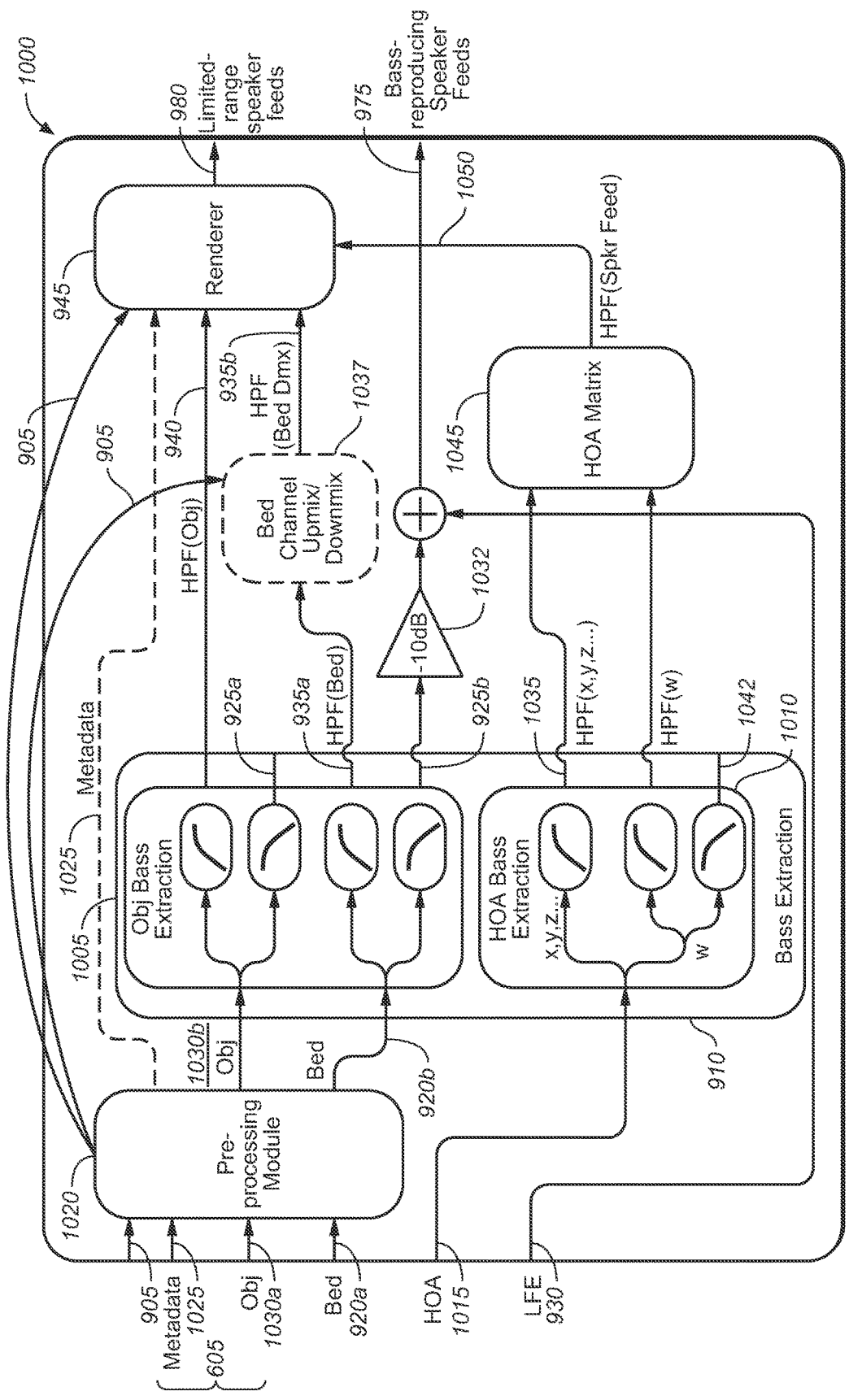
FIG. 10 is a block diagram that illustrates an alternative audio processing system.

FIG. 10 is a block diagram that illustrates an alternative audio processing system. In this example, the audio processing system 1000 is configured for pre-processing audio data before applying a bass extraction process. Moreover, the audio processing system 1000 is configured for processing audio data that includes sound field representation data, which is higher-order Ambisonics™ (HOA) data 1015 in this example. Here, the bass extraction module 910 includes an audio object bass extraction module 1005 and an HOA bass extraction module 1010, the latter of which is configured for processing HOA data 1015. Other bass extraction modules may be present to extract bass from sound field data represented in formats other than HOA.

In this implementation, the pre-processing module 1020 receives the audio object signals 1030*a*, the audio bed signals 920*a*, the metadata 1025 associated with the audio object 605 and the playback environment data 905. The pre-processing module 1020 may be configured for applying a gain to the audio object signals 1030*a* according to at least one of the audio object metadata or the playback environment data 905. For example, the pre-processing module 1020 may apply a gain according to audio object gain metadata associated with an audio object.

In some implementations, the pre-processing module 1020 may be configured to prevent "clipping" or speaker overload of speakers in a playback environment. For example, after applying gains to multiple audio objects according to audio object gain metadata, the pre-processing module 1020 may be configured to evaluate the total gain to be applied to a speaker feed signal. If the total gain exceeds a predetermined threshold, the pre-processing module 1020 may be configured to reduce the total gain in order to avoid overloading a speaker. In this example, the pre-processing module 1020 is configured to provide pre-processed audio object signals 1030*b* and the pre-processed audio bed signals 920*b* to the audio object bass extraction module 1005.

Here, the audio object bass extraction module 1005 is configured to make a copy of the pre-processed audio object signals 1030*b* and the pre-processed audio bed signals 920*b*, thereby creating two substantially identical instances. In this example, the audio object bass extraction module 1005 is configured to apply a high-pass filter to a first instance of the pre-processed audio object signals 1030*b* and to forward the resulting high-pass filtered audio object signals 940 to the renderer 945. Here, the audio object bass extraction module 1005 is configured to apply a low-pass filter to a second instance of the pre-processed audio object signals 1030b and to forward the extracted bass signals 925a to the gain reduction element 1032. In this example, the gain reduction element 1032 levels the amplitude of the LFE audio data 930 and the extracted bass signals 925a by decreasing the amplitude of the extracted bass signals 925a by 10 dB. In other embodiments, extracted bass signals 925a are not attenuated and leveling is achieved by amplifying LFE audio signals represented by the LFE audio data 930.

Similarly, in this example the audio object bass extraction module 1005 is configured to apply a high-pass filter to a first instance of the pre-processed audio bed signals 920b and to forward the resulting high-pass filtered bed signals 935a to the optional bed channel upmix/downmix module 1037. As described above, the bed channel upmix/downmix module 1037 may be configured to compare the number of input channels with the number of output channels of a playback environment (e.g., according to the to the playback environment data 905) and to either upmix, downmix or pass through the high-pass filtered bed signals 935a accordingly. In this example, the bed channel upmix/downmix module 1037 has determined that the number of output channels of a playback environment exceeds the number of input bed channels, applied a downmix process to the high-pass filtered bed signals 935a and forwarded the downmixed high-pass filtered bed signals 935b to the renderer 945. Here, the audio object bass extraction module 1005 is configured to apply a low-pass filter to a second instance of the pre-processed audio bed signals 920b and to forward the extracted bass signals 925b to the gain reduction element 1032.

In this example, the HOA bass extraction module 1010 is configured for applying a bass extraction process and a high-pass filter to different copies of a first portion of the sound field representation data and for applying a high-pass filter, but not applying a bass extraction process, to a second portion of the sound field representation data. The HOA bass extraction module 1010 may be configured to maintain the phase between the first and second portions of the sound field representation data. Because low frequency data for an HOA signal can be extracted from a first portion of the signal, the HOA bass extraction module 1010 extracts the bass from the first portion. Other bass extraction modules (not shown) may extract bass from a portion or all of a sound field signal represented in other formats.

In the example shown in FIG. 10, the sound field representation data is HOA data 1015, specifically higher-order B-format Ambisonics™ data. In other implementations, the HOA bass extraction module 1010 may be configured to receive and process different types of sound field representation data, such as G format and/or UHJ format data. Here, the HOA bass extraction module 1010 is configured to process the W channel data of the HOA data 1015 differently from the other channels. In this example, the other channels are high-pass filtered and the resulting high-pass filtered data 1035 is provided to the HOA matrix module 1045. However, in this implementation the HOA bass extraction module 1010 is configured to make a copy of the W channel data, so that there are two substantially identical instances of the W channel data. One instance is high-pass filtered and the resulting high-pass filtered W channel data 1040 is provided to the HOA matrix module 1045. The other instance of the W channel data is low-pass filtered and the resulting extracted W channel bass signals 1042 are sent to the gain reduction element 1032. In this example, the audio processing system 1000 is configured to combine the extracted bass signals 925, as output by the gain reduction element 1032, with the LFE audio data 930 and is output as bass-reproducing speaker feeds 975.

In this example, the HOA matrix module 1045 is configured to process the high-pass filtered data 1035 and the high-pass filtered W channel data 1040, and to output high-pass filtered speaker feed signals 1050 to the renderer 945. In some implementations, the HOA matrix module 1045 may be configured to process the high-pass filtered data 1035 and the high-pass filtered W channel data 1040 according to a time-invariant process, e.g., by reference to a look-up table or another such data structure.

In this example, the renderer 945 is configured to produce speaker feed signals for the high-pass filtered audio object signals 940, based at least in part on the playback environment data 905 and the metadata 1025. The renderer 945 may be configured to combine the high-pass filtered bed signals 935b and the high-pass filtered speaker feed signals 1050 with other speaker feed signals that are produced by the renderer 945 and to output limited-range speaker feed signals 980.

Figure 11:
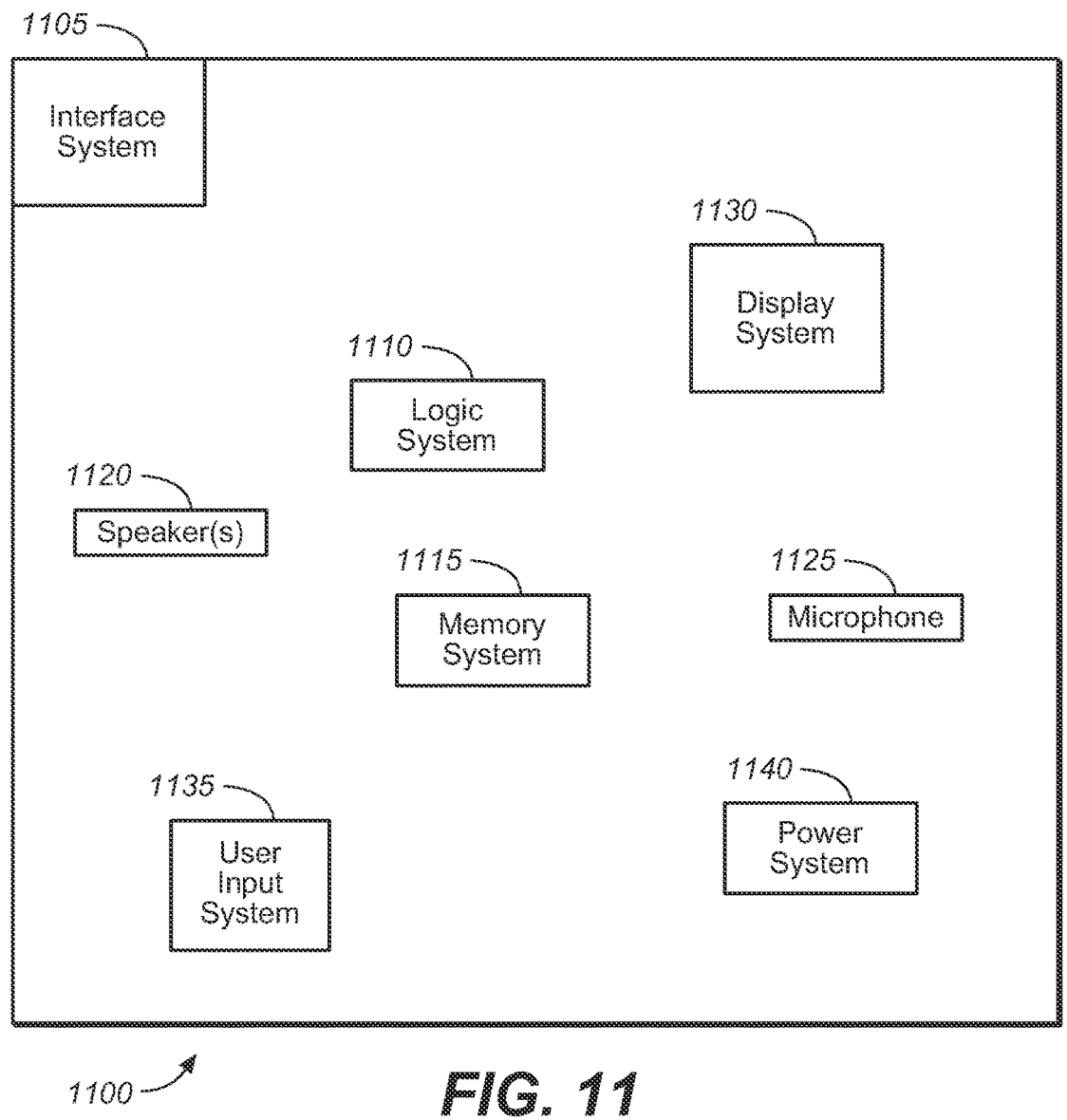
FIG. 11 is a block diagram that provides examples of components of an authoring and/or rendering apparatus.

FIG. 11 is a block diagram that provides examples of components of an authoring and/or rendering apparatus. In this example, the device 1100 includes an interface system 1105. The interface system 1105 may include a network interface, such as a wireless network interface. Alternatively, or additionally, the interface system 1105 may include a universal serial bus (USB) interface or another such interface.

The device 1100 includes a logic system 1110. The logic system 1110 may include a processor, such as a general purpose single- or multi-chip processor. The logic system 1110 may include a digital signal processor (DSP), an application specific integrated circuit (ASIC), a field programmable gate array (FPGA) or other programmable logic device, discrete gate or transistor logic, or discrete hardware components, or combinations thereof. The logic system 1110 may be configured to control the other components of the device 1100. Although no interfaces between the components of the device 1100 are shown in FIG. 11, the logic system 1110 may be configured with interfaces for communication with the other components. The other components may or may not be configured for communication with one another, as appropriate.

The logic system 1110 may be configured to perform audio processing functionality, including but not limited to the types of audio authoring, rendering and/or bass management functionality described herein. In some such implementations, the logic system 1110 may be configured to operate (at least in part) according to software stored one or more non-transitory media. The non-transitory media may include memory associated with the logic system 1110, such as random access memory (RAM) and/or read-only memory (ROM). The non-transitory media may include memory of the memory system 1115. The memory system 1115 may include one or more suitable types of non-transitory storage media, such as flash memory, a hard drive, etc.

The display system 1130 may include one or more suitable types of display, depending on the manifestation of the device 1100. For example, the display system 1130 may include a liquid crystal display, a plasma display, a bistable display, etc.

The user input system 1135 may include one or more devices configured to accept input from a user. In some implementations, the user input system 1135 may include a touch screen that overlays a display of the display system 1130. The user input system 1135 may include a mouse, a track ball, a gesture detection system, a joystick, one or more GUIs and/or menus presented on the display system 1130, buttons, a keyboard, switches, etc. In some implementations, the user input system 1135 may include the microphone 1125: a user may provide voice commands for the device 1100 via the microphone 1125. The logic system may be configured for speech recognition and for controlling at least some operations of the device 1100 according to such voice commands.

The power system 1140 may include one or more suitable energy storage devices, such as a nickel-cadmium battery or a lithium-ion battery. The power system 1140 may be configured to receive power from an electrical outlet.

Various modifications to the implementations described in this disclosure may be readily apparent to those having ordinary skill in the art. The general principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A method, comprising:
   receiving audio data including audio objects, the audio objects comprising audio object signals and associated metadata, the associated metadata including positional metadata for the audio objects;
   applying a bass extraction process involving low-pass filters to the audio object signals, to produce extracted low-frequency audio signals;
   applying a high-pass filter to at least some of the audio object signals, to produce high-pass filtered audio signals;
   receiving playback environment data comprising an indication of a number of speakers in a playback environment, an indication of the location of each speaker within the playback environment and an indication of one or more speakers capable of reproducing low-frequency audio signals;
   rendering, after the bass extraction process, the high-pass filtered audio signals for the audio objects into one or more high-pass filtered speaker feed signals based, at least in part, on the playback environment data and the associated metadata, wherein each speaker feed signal corresponds to at least one of the speakers of the playback environment; and
   performing a bass management process on the extracted low-frequency audio signals, wherein the bass management process involves routing the extracted low-frequency audio signals to the one or more speakers capable of reproducing low-frequency audio signals,
   wherein the audio data includes sound field representation data, further comprising:
      applying a bass extraction process and a high-pass filter to different copies of a first portion of the sound field representation data; and
      applying a high-pass filter, but not applying a bass extraction process, to different copies of a second portion of the sound field representation data.

2. The method of claim 1, wherein the bass management process involves limiting amplitudes of at least some low-frequency audio signals.

3. The method of claim 1, wherein the bass management process involves combining the extracted low-frequency audio signals and the speaker feed signals.

4. The method of claim 1, wherein the audio data includes audio bed signals corresponding to speaker locations and wherein the applying process involves applying a bass extraction process to at least some of the audio bed signals.

5. The method of claim 4, further comprising applying an upmix or a downmix process to the audio bed signals, the upmix or downmix process being based, at least in part, on the number of speakers in the playback environment.

6. The method of claim 1, further comprising pre-processing the audio data before applying the bass extraction process.

7. The method of claim 6, wherein the pre-processing involves applying a gain to the audio object signals according to at least one of the audio object metadata or the playback environment data.

8. The method of claim 1, wherein the audio data are received as a pulse-code modulation stream.

9. The method of claim 1, wherein the audio data are received and processed by an upmix including speaker array processing.

10. A method, comprising:
    receiving audio data including audio objects, the audio objects comprising audio object signals and associated metadata, the associated metadata including positional metadata for the audio objects;
    applying a bass extraction process involving low-pass filters to the audio object signals, to produce extracted low-frequency audio signals;
    applying a high-pass filter to at least some of the audio object signals, to produce high-pass filtered audio signals;
    receiving playback environment data comprising an indication of a number of speakers in a playback environment, an indication of the location of each speaker within the playback environment and an indication of one or more speakers capable of reproducing low-frequency audio signals;
    rendering, after the bass extraction process, the high-pass filtered audio signals for the audio objects into one or more high-pass filtered speaker feed signals based, at least in part, on the playback environment data and the associated metadata, wherein each speaker feed signal corresponds to at least one of the speakers of the playback environment; and
    performing a bass management process on the extracted low-frequency audio signals, wherein the bass management process involves routing the extracted low-frequency audio signals to the one or more speakers capable of reproducing low-frequency audio signals,
    wherein the received audio data includes a low-frequency effect audio channel, wherein the bass management process further comprises mixing the extracted low-frequency audio signals with low-frequency effect audio data of the low-frequency effect audio channel.

11. The method of claim 10, wherein the bass management process involves limiting amplitudes of at least some low-frequency audio signals.

12. The method of claim 10, wherein the bass management process involves combining the extracted low-frequency audio signals and the speaker feed signals.

13. The method of claim 10, wherein the audio data includes audio bed signals corresponding to speaker locations and wherein the applying process involves applying a bass extraction process to at least some of the audio bed signals.

14. The method of claim 13, further comprising applying an upmix or a downmix process to the audio bed signals, the upmix or downmix process being based, at least in part, on the number of speakers in the playback environment.

15. The method of claim 10, further comprising pre-processing the audio data before applying the bass extraction process.

16. The method of claim 15, wherein the pre-processing involves applying a gain to the audio object signals according to at least one of the audio object metadata or the playback environment data.

17. The method of claim 10, wherein the audio data are received as a pulse-code modulation stream.

18. The method of claim 10, wherein the audio data are received and processed by an upmix including speaker array processing.

19. The method of claim 10, further comprising leveling the extracted low-frequency audio signals with the low-frequency effect audio channel before mixing, the leveling process involving at least one of amplifying the low-frequency effect audio data or attenuating the extracted low-frequency audio signals.

20. A non-transitory computer readable medium having software stored thereon, the software including instructions for controlling at least one apparatus to:
receive audio data including audio objects, the audio objects comprising audio object signals and associated metadata, the associated metadata including positional metadata for the audio objects;
apply a bass extraction process involving low-pass filters to the audio object signals, to produce extracted low-frequency audio signals;
apply a high-pass filter to at least some of the audio object signals, to produce high-pass filtered audio signals;
receive playback environment data comprising an indication of a number of speakers in a playback environment, an indication of the location of each speaker within the playback environment and an indication of one or more speakers capable of reproducing low-frequency audio signals;
render, after the bass extraction process, high-pass filtered audio signals for the audio objects into one or more high-pass filtered speaker feed signals based, at least in part, on the playback environment data and the associated metadata, wherein each speaker feed signal corresponds to at least one of the speakers of the playback environment; and
perform a bass management process on the extracted low-frequency audio signals, wherein the bass management process involves routing the extracted low-frequency audio signals to the one or more speakers capable of reproducing low-frequency audio signals,
wherein the audio data includes sound field representation data and wherein the software includes instructions for controlling the at least one apparatus to:
apply a bass extraction process and a high-pass filter to different copies of a first portion of the sound field representation data; and
apply a high-pass filter, but not to apply a bass extraction process, to different copies of a second portion of the sound field representation data.

21. An apparatus, comprising:
an interface; and
a logic system capable of:
receiving audio data including audio objects, the audio objects comprising audio object signals and associated metadata, the associated metadata including positional metadata for the audio objects;
applying a bass extraction process involving low-pass filters to the audio object signals, to produce extracted low-frequency audio signals;
applying a high-pass filter to at least some of the audio object signals, to produce high-pass filtered audio signals;
receiving playback environment data comprising an indication of a number of speakers in a playback environment, an indication of the location of each speaker within the playback environment and an indication of one or more speakers capable of reproducing low-frequency audio signals;
rendering, after the bass extraction process, high-pass filtered audio signals for the audio objects into one or more high-pass filtered speaker feed signals based, at least in part, on the playback environment data and the associated metadata, wherein each speaker feed signal corresponds to at least one of the speakers of the playback environment; and
performing a bass management process on the extracted low-frequency audio signals, wherein the bass management process involves routing the extracted low-frequency audio signals to the one or more speakers capable of reproducing low-frequency audio signals,
wherein the audio data includes sound field representation data, further comprising:
applying a bass extraction process and a high-pass filter to different copies of a first portion of the sound field representation data; and
applying a high-pass filter, but not applying a bass extraction process, to different copies of a second portion of the sound field representation data.

22. The apparatus of claim 21, wherein the bass management process involves limiting amplitudes of at least some low-frequency audio signals.

23. The apparatus of claim 21, wherein the bass management process involves combining the extracted low-frequency audio signals and the speaker feed signals.

24. The apparatus of claim 21, wherein the audio data includes audio bed signals corresponding to speaker locations and wherein the applying process involves applying a bass extraction process to at least some of the audio bed signals.

25. The apparatus of claim 24, further comprising applying an upmix or a downmix process to the audio bed signals, the upmix or downmix process being based, at least in part, on the number of speakers in the playback environment.

26. The apparatus of claim 21, further comprising pre-processing the audio data before applying the bass extraction process.

27. The apparatus of claim 26, wherein the pre-processing involves applying a gain to the audio object signals according to at least one of the audio object metadata or the playback environment data.

28. The apparatus of claim 21, wherein the audio data are received as a pulse-code modulation stream.

29. The apparatus of claim 21, wherein the audio data are received and processed by an upmix including speaker array processing.

30. An apparatus, comprising:
an interface; and
a logic system capable of:
receiving audio data including audio objects, the audio objects comprising audio object signals and associated metadata, the associated metadata including positional metadata for the audio objects;

applying a bass extraction process involving low-pass filters to the audio object signals, to produce extracted low-frequency audio signals;

applying a high-pass filter to at least some of the audio object signals, to produce high-pass filtered audio signals;

receiving playback environment data comprising an indication of a number of speakers in a playback environment, an indication of the location of each speaker within the playback environment and an indication of one or more speakers capable of reproducing low-frequency audio signals;

rendering, after the bass extraction process, the high-pass filtered audio signals for the audio objects into one or more high-pass filtered speaker feed signals based, at least in part, on the playback environment data and the associated metadata, wherein each speaker feed signal corresponds to at least one of the speakers of the playback environment; and performing a bass management process on the extracted low-frequency audio signals, wherein the bass management process involves routing the extracted low-frequency audio signals to the one or more speakers capable of reproducing low-frequency audio signals, wherein the received audio data includes a low-frequency effect audio channel, wherein the bass management process further comprises mixing the extracted low-frequency audio signals with low-frequency effect audio data of the low-frequency effect audio channel.

31. The apparatus of claim 30, wherein the bass management process involves limiting amplitudes of at least some low-frequency audio signals.

32. The apparatus of claim 30, wherein the bass management process involves combining the extracted low-frequency audio signals and the speaker feed signals.

33. The apparatus of claim 30, wherein the audio data includes audio bed signals corresponding to speaker locations and wherein the applying process involves applying a bass extraction process to at least some of the audio bed signals.

34. The apparatus of claim 33, further comprising applying an upmix or a downmix process to the audio bed signals, the upmix or downmix process being based, at least in part, on the number of speakers in the playback environment.

35. The apparatus of claim 30, further comprising pre-processing the audio data before applying the bass extraction process.

36. The apparatus of claim 35, wherein the pre-processing involves applying a gain to the audio object signals according to at least one of the audio object metadata or the playback environment data.

37. The apparatus of claim 30, wherein the audio data are received as a pulse-code modulation stream.

38. The apparatus of claim 30, wherein the audio data are received and processed by an upmix including speaker array processing.

39. The apparatus of claim 30, further comprising leveling the extracted low-frequency audio signals with the low-frequency effect audio channel before mixing, the leveling process involving at least one of amplifying the low-frequency effect audio data or attenuating the extracted low-frequency audio signals.

40. A non-transitory computer readable medium having software stored thereon, the software including instructions for controlling at least one apparatus to:

receive audio data including audio objects, the audio objects comprising audio object signals and associated metadata, the associated metadata including positional metadata for the audio objects;

apply a bass extraction process involving low-pass filters to the audio object signals, to produce extracted low-frequency audio signals;

apply a high-pass filter to at least some of the audio object signals, to produce high-pass filtered audio signals;

receive playback environment data comprising an indication of a number of speakers in a playback environment, an indication of the location of each speaker within the playback environment and an indication of one or more speakers capable of reproducing low-frequency audio signals;

render, after the bass extraction process, high-pass filtered audio signals for the audio objects into one or more high-pass filtered speaker feed signals based, at least in part, on the playback environment data and the associated metadata, wherein each speaker feed signal corresponds to at least one of the speakers of the playback environment; and perform a bass management process on the extracted low-frequency audio signals, wherein the bass management process involves routing the extracted low-frequency audio signals to the one or more speakers capable of reproducing low-frequency audio signals, wherein the received audio data includes a low-frequency effect audio channel, wherein the bass management process further comprises mixing the extracted low-frequency audio signals with low-frequency effect audio data of the low-frequency effect audio channel.

* * * * *